United States Patent [19]

Brennan

[11] Patent Number: 5,140,548
[45] Date of Patent: Aug. 18, 1992

[54] FERROELECTRIC SPACE CHARGE CAPACITOR MEMORY

[75] Inventor: Ciaran J. Brennan, Allston, Mass.

[73] Assignee: The Charles Stark Draper Laboratory, Inc., Cambridge, Mass.

[21] Appl. No.: 630,038

[22] Filed: Dec. 19, 1990

[51] Int. Cl.⁵ ............................................. G11C 11/22
[52] U.S. Cl. .................................. 365/145; 365/189.01
[58] Field of Search ............................ 365/145, 189.01

[56] References Cited

U.S. PATENT DOCUMENTS 5,046,043 9/1991 Miller et al. ...................... 365/145

Primary Examiner—Terrell W. Fears
Attorney, Agent, or Firm—Iandiorio & Dingman

[57] ABSTRACT

A ferroelectric space charge capacitor memory device includes a pair of spaced first and second electrodes; a ferroelectric dielectric disposed between the electrodes; means for applying a coercive voltage to the dielectric to write the dielectric into one of two polarization states and to establish in each polarization state in the dielectric a space charge region proximate each electrode having a charge opposite to that of the electrode with a neutral region between the space charge regions, the relative sizes of the neutral and space charge regions defining the capacitance of the dielectric, the neutral region having an internal polarization field opposite to that represented by the space charge regions; means for applying to the dielectric a bias voltage less than the coercive voltage at a rate lower than the rate of space charge formation to define a capacitance level representative of one of the polarization states; means for introducing to the dielectric a read signal at a rate faster than the rate of space charge formation, which together with the bias voltage is less than the coercive voltage; and means responsive to the introduction of the read signal to the dielectric for determining the capacitance level representative of one of the polarization states.

5 Claims, 2 Drawing Sheets

FERROELECTRIC SPACE CHARGE CAPACITOR MEMORY

FIELD OF INVENTION

This invention relates to a ferroelectric space charge capacitor memory device, and more particularly to such a device which effects the memory function, non-destructively, by utilizing the variation in capacitance resulting from the variation in the space charge with respect to the internal polarization.

BACKGROUND OF INVENTION

Present non-volatile digital memories utilize several technologies, including magnetic media, magnetic bubble, floating gate, optical media, and destructive read-out ferroelectric memories. Each of these techniques has certain disadvantages. Magnetic media memories include magnetic disk, magnetic tape, magnetic core, plated wire, and magnetic bubble memories. The magnetic disk and magnetic tape memories involve mechanical systems to access the data, and are therefore slow, bulky, and sensitive to shock and vibration. Magnetic core and plated wire memories are physically large, slow to read and write, and are not compatible with modern very large scale integration (VLSI) electronics. Magnetic bubble memories have long access times to read and write, and do not allow random access addressing of the stored data. Floating gate memories include devices referred to as EEPROMS (electrically-erasable programmable read-only memories) and FLASH memories. Both these terms refer to integrated circuit memories which are capable of reading and writing binary data. These memories store data by means of electrical charge stored on an insulated MOS-FET gate. They are slow to write data, slow to erase data, and are very sensitive to radiation. Optical memory devices utilize mechanical devices to access the data. The read and write times of these devices are slow, they are large and heavy, and they are sensitive to shock and vibration.

Ferroelectric memories are a relatively new technology. Methods to detect the state of a ferroelectric memory capacitor fall into two categories: destructive read-out and non-destructive read-out. Destructive read-out alters the polarization state of the ferroelectric memory capacitor during the read process, so the capacitor must be restored to its original state after the read-out in order to preserve the data. This is the memory technique currently in use for ferroelectric memories. There are two disadvantages to the destructive read-out method. The first is that the repeated reading and writing using coercive voltage levels required by the destructive read-out wears out the ferroelectric material, causing it to lose its retentive properties. The second disadvantage is that information stored in the memory that uses destructive read-out may be lost if the memory is upset by an electrical or radiation transient between the time that the ferroelectric capacitor is read and the time when its original state is restored. In other words, the destructive read-out cycle introduces a time period in which the memory is volatile, that is, retained only in the electronic state of the circuit.

Methods of non-destructive read-out of ferroelectric memories have been proposed. One such method attempts to utilize the hysteresis in the conductivity of the ferroelectric at low voltage levels. Another method employs ferroelectric dielectric material as the gate insulator in a MOSFET-like device. The conduction of the transistor depends on the polarization of the gate insulator, providing a non-destructive read mechanism. Another method which might be considered non-destructive or partially non-destructive is to perform the memory read with a partial switching of the ferroelectric. The switching of the ferroelectric is performed until the difference in polarities can be differentiated, and then the switching cycle is reversed. This technique subjects the ferroelectric memory capacitor to only a partial, instead of a full, switching cycle.

These methods for non-destructive read-out of a ferroelectric memory have encountered technical problems concerning the properties of the ferroelectric material which so far have made them commercially impractical.

SUMMARY OF INVENTION

It is therefore an object of this invention to provide an improved non-volatile memory device which is small, faster to read and write, less sensitive to shock and vibration, compatible with VLSI technology, allows random access storage and requires no moving parts.

It is a further object of this invention to provide such an improved memory device which has greater radiation hardness.

It is a further object of this invention to provide such an improved memory device which utilizes a ferroelectric space charge capacitance memory device.

It is a further object of this invention to provide such a ferroelectric space charge capacitance device which is non-destructively read out.

It is a further object of this invention to provide such a ferroelectric capacitance device in which the non-destructive read-out does not alter the polarization state of the ferroelectric capacitance device.

It is a further object of this invention to provide such a ferroelectric capacitance device which does not require repeated erasing and rewriting of the data and does not introduce any period of time when the data is volatile.

The invention results from the realization that a practical non-volatile non-destructive memory device can be constructed using a ferroelectric space charge capacitance device in which the hysteresis capacitance effected by the internal polarization and space charge regions in combination with an applied electric field define two distinguishable, stable, and sensible, states.

This invention features a ferroelectric space charge capacitor memory device having a pair of spaced first and second electrodes and a ferroelectric dielectric disposed between the electrodes. There are means for applying a coercive voltage to the dielectric to write the dielectric into one of two polarization states and to establish in each polarization state in the dielectric a space charge region proximate each electrode having a charge opposite to that of the electrode with a neutral region between the space charge regions. The relative size of the neutral and space charge regions define the capacitance of the dielectric; the neutral region has an internal polarization field opposite to that represented by the space charge regions. There are means for applying to the dielectric a bias voltage less than the coercive voltage and at a rate slower than the rate of space charge formation in order to define a capacitance level representative of one of the polarization states. There are means for introducing to the dielectric a read signal at a rate faster than the rate of space charge formation, which together with the bias voltage is less than the coercive voltage. Means responsive to the introduction of the read signal to the dielectric determines the capacitance level representative of one of the polarization states.

In a preferred embodiment the means for determining the capacitance includes means for detecting the displacement current transferred through the dielectric in response to the read signal. The two polarization states include a first state in which the positive pole of the dielectric is proximate the first electrode and the negative pole is proximate the second electrode, and a second state in which the negative pole in the dielectric is proximate the first electrode and the positive pole is proximate the second electrode. The bias voltage establishes an electric field that increases the internal electric field and the size of the space charge regions with a concomitant decrease in capacitance when it is additive with the internal polarization field, and decreases the internal electric field and the size of the space charge regions with a concomitant increase in capacitance when it is subtractive with the internal polarization field. The read signal momentarily introduces through the dielectric a displacement current which is proportional to the capacitance representative of the polarization state of the dielectric.

DISCLOSURE OF PREFERRED EMBODIMENT

Other objects, features and advantages will occur to those skilled in the art from the following description of a preferred embodiment and the accompanying drawings, in which.

Figure 1:
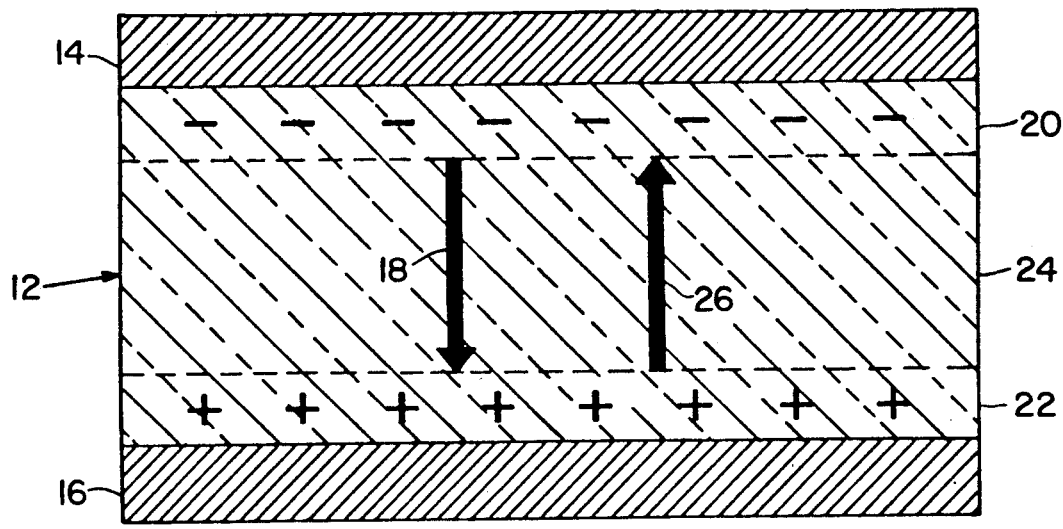
FIG. 1 is a schematic diagram of a ferroelectric space charge capacitance memory device according to this invention.

There is shown in FIG. 1 a ferroelectric space charge capacitor memory device 10 including a ferroelectric dielectric medium 12 disposed between a pair of spaced electrodes 14 and 16. Ferroelectric dielectric medium 12 may be a lead-zirconium-titanate or lead-titanate ferroelectric available from Raytheon or National Semiconductor. When an external electric potential is applied across electrodes 14 and 16, an internal polarization field indicated by vector 18 is established in dielectric medium 12 by the alignment of the electric dipoles. This internal polarization field is in the same direction as the externally applied potential or voltage at electrodes 14 and 16. There results an accumulation of charge in space charge regions 20 and 22. Space charge region 20 accumulates negative charges since it is proximate electrode 14 which has a positive potential applied to it, while space charge region 22 accumulates a positive charge since it is associated with electrode 16 that has a negative potential applied to it. The accumulations of space charge at the contacts produces an electric field 26 which opposes the remanent polarization.

A neutral region 24 occurs between space charge regions 20 and 22. The size of this neutral region 24 relative to the space charge regions establishes the capacitance value of the capacitor constituted by electrodes 14 and 16 with the dielectric material between them. As neutral region 24 becomes larger, so too does the capacitance of device 10. The size of the neutral region available to establish the capacitance value of device 10 varies inversely to the applied field. That is, as the field across electrodes 14 and 16 grows larger the neutral region 24 grows smaller, and so does the capacitance of device 10.

If the initial voltage or write voltage applied across electrodes 14 and 16 reaches the coercive voltage of dielectric 12, then a certain amount of polarization, the remanent polarization, remains even after the external electric potential is removed from electrodes 14 and 16. If it is later desired to read out device 10, that is, to determine its remanent state, it is only necessary to apply a bias voltage across the electrodes 14 and 16 which is less than the coercive voltage and then apply a small read pulse which will produce a current proportional to the value of the capacitance established in neutral region 24. The bistable nature of the device 10 which enables it to be used as a memory can be better understood with respect to FIG. 2, which shows the capacitance hysteresis characteristic 30 of device 10.

There are two polarization states which device 10 can assume. The first is when the system moves from point 32 driven by a positive voltage through knee 34, leg 36 and toe 38, back along leg 40 to point 32. In that case, the polarization state shown in FIG. 1 occurs. If the write voltage instead is applied in the negative direction so that the system moves through knee 42, leg 44 and toe 46, and back up leg 48 to point 32, then the space charge regions will be charged oppositely from that shown in FIG. 1 and the internal polarization vector 18 will be reversed, to thereby establish the other polarization state.

Figure 2:
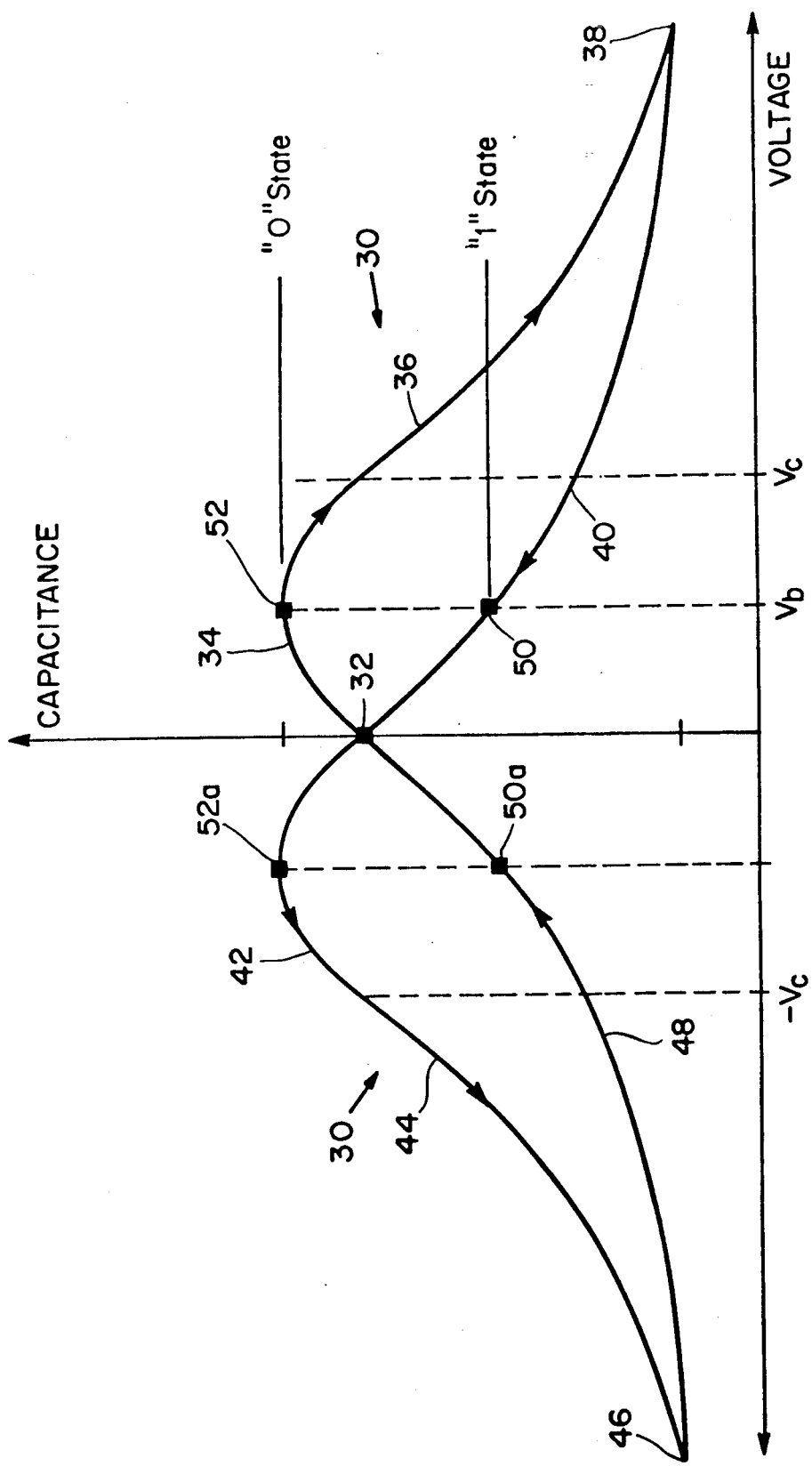
FIG. 2 is an illustration of the capacitance hysteresis characteristic of the ferroelectric capacitance memory device of FIG. 1.

In operation, with zero voltage applied across electrodes 14 and 16, the dielectric 12 is in the condition indicated at point 32 in FIG. 2. If the voltage across electrodes 14 and 16 is then increased, the capacitance value of the ferroelectric medium 12 increases up along knee 34 along leg 36 to positive toe 38. If at this point the positive voltage is decreased the capacitance value moves along leg 40 back to point 32. If the voltage is now increased in the negative direction, the capacitance value increases toward knee 42 and then decreases down leg 44 to the negative toe 46. A decrease in the negative voltage now moves the capacitance value along leg 48 back to point 32.

This capacitance hysteresis effect in the dielectric 12 can be utilized as a memory device. For example, if a voltage has been applied at point 32, which drives the capacitance value up over knee 34, down leg 36 to toe 38 and back along leg 40 so that the system has been driven beyond the coercive voltage $V_C$ and back again to the lower, positive bias voltage $V_b$ at point 50 on leg 40, the bit of information has been written into dielectric medium 12. If the voltage across electrodes 14 and 16 is now removed completely so that the system reverts to point 32, ferroelectric medium 12 stores or remembers its last previous condition at point 50. Subsequently, if a bias voltage $V_b$ is applied, ferroelectric medium 12 moves back down leg 40 to point 50. Now a small high-frequency pulse superimposed on $V_b$ at 50 causes a current to flow through medium 12 which is proportional to its capacitance and will thus reflect its polarization condition, which in this case is the polarization condition indicated by the low capacitance level at 50.

If during the write cycle the voltage was driven negative from point 32 over knee 42, down leg 44 to toe 46, back again up leg 48, through zero point 32, to point 52 on knee 34, then when the voltage is removed and the system reverts to point 32, it is the point 52 condition that will be remembered. Thus subsequently when the read bias $V_b$ is applied, the system will move to point 52, which is a much higher capacitive state, indicating the other polarization state. Thus when a small high-frequency read pulse is applied, a higher level of current flow indicating a higher level of capacitance will be indicated.

In FIG. 2, the lower level of capacitance 50 has been labelled the binary one state while the higher level of capacitance 52 has been labelled the zero state. This is arbitrary as the converse denomination could also have been chosen. Similarly, instead of applying a positive bias voltage, the system could work with a negative bias voltage, in which case the capacitive states thus far explained would be reversed, and the "1" and "0" values would be inverted. In either case the bias voltage $V_b$, be it positive or negative, must not exceed the coercive voltage, $V_b$ must be applied at a rate slower than the rate at which the space charge can form, and the read pulse should have a high enough frequency, typically 1000 cycles per second or greater, so that it can induce the current to detect the capacitance level before the space charge distributions can be affected. The signal should be small in magnitude so that it does not exceed the coercive voltage when added to the bias voltage.

Figure 3:
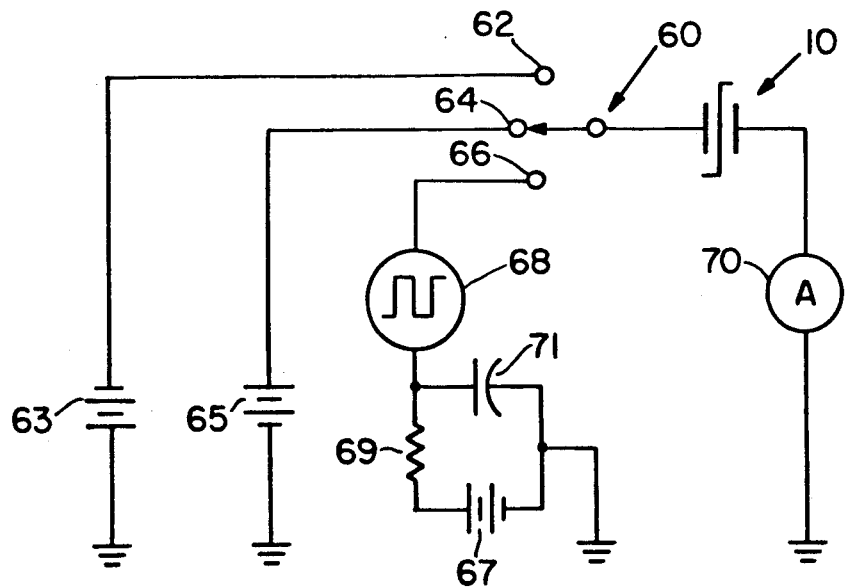
FIG. 3 is a simplified schematic diagram of a write and read circuit usable with the ferroelectric space charge capacitance memory device of FIG. 1.

A simple implementation of a circuit for writing and reading memory device 10, FIG. 1, is shown in FIG. 3, where memory device 10 is connected through a three-way switch 60 to the write 62, 64 and read terminals 66. When switch 60 is connected to terminal 62, negative bias is applied from battery 63 through switch 60 to write a zero into device 10. When switch 60 is connected to terminal 64, a positive bias is applied from battery 65 to device 10 to write a one. Subsequently, when those biases are removed the remanent polarization maintains the one or the zero that was written there. Later, when switch 60 is connected to terminal 66, the bias voltage $V_b$ is applied from battery 67 to drive the system to the remembered point, such as point 50, along the hysteresis characteristic 30. Resistor 69 and capacitor 71 limit the rate at which the bias voltage is applied, which must be slower than the rate at which the space charge forms. To accomplish this, the product of the resistance of resistor 69 and the capacitance of capacitor 71 must be greater than the time for space charge accumulation (1 ms–100 ms). Then a small high-frequency pulse is supplied by pulse generator 68 to produce a current flow through device 10 which can be detected by an AC current sensor 70. If the current is low, i.e. the capacitance sensed is low, then that represents a 1 state as explained in FIG. 2. If the current is high, that indicates high capacitance, which represents a zero state.

The distinction between this invention and prior art ferroelectric capacitor memory devices is that the prior art devices change the state of polarization during read-out while this invention does not. In prior art ferroelectric capacitor devices the read voltage displaces the internal polarization field and generates a pulse of current whose magnitude represents the state (0 or 1) of the capacitor memory. In contrast, this invention manipulates the dielectric properties of the ferroelectric capacitor to effect the memory function. In this invention the bias voltage does not displace the internal polarization field. Rather, the bias voltage displaces and is completely dropped across the space charges without affecting the internal polarization field. The bias voltage is less than the coercive voltage and is applied more slowly than the rate at which the space charge can form. That is, the bias voltage is not allowed to exceed the space charge and begin to displace the internal polarization field. In lead-zirconate and lead-zirconate-titanate it is preferred that the bias voltage reach maximum in more than approximately one millisecond for typical thin film, high-quality, ferroelectric capacitor material.

To read out the state of the memory a read pulse is applied superimposed on the bias voltage. The total of the bias voltage and the read pulse does not exceed the coercive voltage. Further, the rate of application and removal of the read pulse is faster than the space charge can respond so that the resulting read current occurs before there is any significant change in the size of the space charge relative to the internal polarization field. Thus, even though there is a momentary transfer of charge there is no net effect on the internal polarization field. Therefore, the read-out operation is entirely non-destructive.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A ferroelectric space charge capacitor memory device comprising:

a pair of spaced first and second electrodes;

a ferroelectric dielectric disposed between said electrodes;

means for applying a coercive voltage to said dielectric to write said dielectric into one of two polarization states and to establish in each polarization state in said dielectric a space charge region proximate each electrode having a charge opposite to that of the electrode with a neutral region between the space charge regions, the relative sizes of said neutral and space charge regions defining the capacitance of the dielectric, said neutral region having an internal polarization field opposite to that represented by the space charge regions;

means for applying to said dielectric a bias voltage less than the coercive voltage at a rate slower than the rate of space charge formation to define a capacitance level representative of one of said polarization states;

means for introducing to said dielectric a read signal at a rate faster than the rate of space charge formation which together with the bias voltage is less than the coercive voltage; and means, responsive to the introduction of the read signal to said dielectric, for determining the capacitance level representative of one of said polarization states.

2. The ferroelectric space charge capacitor memory device of claim 1 in which said means for determining the capacitance includes means for detecting the displacement current transferred through said dielectric in response to said read signal.

3. The ferroelectric space charge capacitor memory device of claim 1 in which said two polarization states include a first state in which the positive pole of the dielectric is proximate said first electrode and the negative pole is proximate said second electrode, and a second state in which the negative pole of the dielectric is proximate said first electrode and the positive pole is proximate said second electrode.

4. The ferroelectric space charge capacitor memory device of claim 1 in which said bias voltage establishes an electric field that increases said internal electric field and the size of said space charge region with a concomitant decrease in capacitance when it is additive with said internal polarization field, and decreases said internal electric field and the the size of said space charge region with a concomitant increase in capacitance when it is subtractive with said internal polarization field.

5. The ferroelectric space charge capacitor memory device of claim 1 in which said read signal momentarily induces through said dielectric a displacement current which is proportional to the capacitance representative of the polarization state of said dielectric.

* * * * *